(12) United States Patent
Matsubara

(10) Patent No.: US 7,088,754 B2
(45) Date of Patent: Aug. 8, 2006

(54) SEMICONDUCTOR LASER DEVICE AND OPTICAL PICKUP DEVICE

(75) Inventor: Kazunori Matsubara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 286 days.

(21) Appl. No.: 10/738,978

(22) Filed: Dec. 19, 2003

(65) Prior Publication Data

US 2004/0165627 A1 Aug. 26, 2004

(30) Foreign Application Priority Data

Dec. 19, 2002 (JP) .............................. 2002-367533

(51) Int. Cl.
*H01S 5/00* (2006.01)
(52) U.S. Cl. .................................. 372/43.01
(58) Field of Classification Search .................. 372/36, 372/43.01
See application file for complete search history.

(56) References Cited

U.S. PATENT DOCUMENTS

| 5,057,244 | A | * | 10/1991 | Nitta et al. | ............... | 252/501.1 |
| 5,583,843 | A | * | 12/1996 | Horinouchi | ............... | 369/112.1 |
| 5,727,009 | A | | 3/1998 | Tajiri et al. | | |
| 6,236,477 | B1 | * | 5/2001 | Ishihara et al. | ............. | 359/640 |
| 6,587,481 | B1 | * | 7/2003 | Seong et al. | ................... | 372/9 |

FOREIGN PATENT DOCUMENTS

| JP | 06-203403 | 7/1994 |
| JP | 2003-264332 | 9/2003 |

OTHER PUBLICATIONS

Chinese Office Action mailed Jul. 8, 2005, directed to corresponding foreign application.

* cited by examiner

*Primary Examiner*—James Menefee
(74) *Attorney, Agent, or Firm*—Morrison & Foerster LLP

(57) ABSTRACT

The present invention provides a semiconductor laser devices of hologram laser type, constructed so that the configuration of the optical elements barely changes even if its package expands due to a rise in temperature or moisture absorption. In the semiconductor laser device, a body frame made of an insulating resin contains a semiconductor laser element, a mirror, a photo-detecting element for reading signals, a mirror-mounting base and a detector-mounting base. Also, a holographic element is mounted on the top of the sidewall of the body frame. The mirror-mounting base and the detector-mounting base are made of a resin, wherein each base is integrally formed with the base plate of the body frame and is separated from the sidewall of the body frame.

10 Claims, 7 Drawing Sheets

SEMICONDUCTOR LASER DEVICE AND OPTICAL PICKUP DEVICE

BACKGROUND OF THE INVENTION

1. Field of the Invention

The present invention relates to a semiconductor laser for generating a laser beam and for receiving the laser beam reflected by an object, and to an optical pickup device using the semiconductor laser device.

2. Description of the Prior Art

In optical recording apparatuses using CD-ROMs, MDs (MiniDisk™) or other optical discs as recording media, optical pickups are used for reading signals from the optical disc. Some optical pickups use semiconductor laser devices of hologram laser type. An example of such semiconductor laser devices is disclosed in the Japanese Unexamined Patent Publication No. H06-203403. In this device, a semiconductor laser element, a holographic element and a photo-detecting element are built in a package. The semiconductor laser element generates a laser beam, and the holographic element diffracts the laser beam reflected by an optical disc so that the reflected beam is introduced into the photo-detecting element located apart from the semiconductor laser element.

In the semiconductor laser device disclosed in the aforementioned publication, a mounting part on which the semiconductor laser element is placed is formed in a semiconductor chip used as the photo-detecting element, and the semiconductor laser element is mounted on the photo-detecting element so that both elements constitute a unit. Therefore, when the relative position of the semiconductor laser element and the photo-detecting element should be changed due to, for example, some modification in specification, the position and/or height of the mounting section should be accordingly modified, so that the photo-detecting element itself needs to be newly produced. This is not desirable with respect to the production efficiency.

Accordingly, the applicant has proposed a construction wherein the semiconductor laser element is separated from the photo-receiving element, and both elements are mounted on different mounting bases, as disclosed in the Japanese Unexamined Patent Publication No. 2003-264332 (Japanese Patent Application No. 2002-066601). By this construction, the relative position of the semiconductor laser element and the photo-detecting element can be changed by newly producing only the mounting base having a simple structure, as opposed to the photo-detecting element having a complex structure.

FIGS. 6A–6D show the construction of this semiconductor laser device, where FIG. 6A is a plan view, FIG. 6B is a side view, FIG. 6C is a perspective view and FIG. 6D is another perspective view in which the holographic element is removed to show the inside of the device. In these drawings, numeral 1 denotes a semiconductor laser element, 2 denotes a reflecting mirror, 10 denotes a lead frame, 4 denotes a sub-mount with a monitoring photodiode, 5 denotes a photo-detecting element for reading signals (which consists of a photodiode integrated with a signal-processing circuit), and 6 denotes a holographic element. The holographic element 6 consists of a transparent member (made of glass or resin) having a grating pattern for generating a three-beam formed on its lower face and a holographic pattern for splitting the beam formed on its upper face.

In the construction of FIGS. 6A–6D, the package of the device consists of a body frame 60 made of an insulating resin with a base plate 60a and a sidewall 60b extending along the edge of the base plate 60a. The sidewall 60b has a pair of arc sections 60c facing each other and a pair of straight sections 60d facing each other. The holographic element 6 is mounted on the straight sections 60d. The lead frame 10 extending to the outside, the semiconductor laser element 1, the photo-detecting element 5 and the mirror 2 are located inside the body frame 60. The semiconductor laser element 1 is mounted on the sub-mount 4, which functions as the mounting base. The photo-detecting element 5 and the mirror 2 are each mounted on a separate mounting base made of a resin. The electrodes of the semiconductor laser element 1 and the photo-detecting element 5 are electrically connected to the lead frame 10 by Au (gold) wires 8.

The mirror 2 is located in front of the semiconductor laser element 1 and reflects the laser beam generated by the semiconductor laser element 1 so that the beam changes its direction by 90 degrees and enters the holographic element 6. The photo-detecting element 5 is located one a side of mirror 2 and receives the laser beam reflected by an optical disc and then diffracted by the holographic element 6 into a different direction.

FIGS. 7A–7C show the inside of the above-described semiconductor laser device, where FIG. 7A is the sectional view at line A—A in FIG. 6A, FIG. 7B is the sectional view at line B—B, and FIG. 7C is the sectional view at line C—C. FIGS. 7A and 7B correspond to Y-Z sections on the Cartesian coordinates shown in FIG. 6C. Similarly, FIG. 7C corresponds to an X-Z section.

The detector-mounting base 32 for the photo-detecting element 5 is connected to the straight section 60d of the sidewall 60b of the body frame 60 and located on the island plate 30 of the lead frame 10. Similarly, the mirror-mounting base 33 for the mirror 2 is connected to the straight section 60d of the sidewall 60b of the body frame 60 and located on the island plate 30 of the lead frame 10. The detector-mounting base 32 and the mirror-mounting base 33 are combined together.

In operation, semiconductor laser devices generate heat and have high temperatures. Also, they are often used under the conditions of high temperature and high humidity. As a result, the body frame and the mounting bases, both made of resin, expand due to a rise in temperature or moisture absorption. By the above-described construction, expansion of the body frame 60 causes the detector-mounting base 32 and the mirror-mounting base 33, both connected to the body frame 60, to change their positions. In particular, with reference to the aforementioned coordinates, the expansion of the body frame 60 causes the detector-mounting base 32 and the mirror-mounting base 33, both connected to the body frame 60, to move in the negative direction of the Y-axis. The expansion of the detector-mounting base 32 and the mirror-mounting base 33, which are combined together, cause them to move away from each other; the detector-mounting base 32 moves in the positive direction of the X-axis, and the mirror-mounting base 33 moves in the negative direction of the X-axis. In this case, either of the two bases that is less resistant to external forces will be displaced.

Displacement of these mounting bases 32, 33 would lead to an error in the optical configuration of the elements 1, 2, 5 and 6, which are normally adjusted to the optimal positions. Consequently, the convergence position of the laser beam on the photo-detecting element 5 would change, so that the photo-detecting element 5 could not receive the laser beam in the optimal condition. Such a condition of the photo-detecting element 5 would deteriorate the reliability of the optical pickup device in reading signals.

SUMMARY OF THE INVENTION

In view of the aforementioned problems, the present invention has been achieved to provide a semiconductor laser device wherein the configuration of the optical elements barely changes. Another objective is to provide an optical pickup device having a high level of reliability in reading signals.

To achieve the aforementioned objectives, the present invention provides a semiconductor laser device including: a semiconductor laser element for generating a laser beam; a photo-detecting element for receiving the laser beam; a holographic element for guiding the laser beam generated by the semiconductor laser element to the outside and for guiding the laser beam reflected by an external object to the photo-detecting element; a body frame made of a resin having a base plate and a sidewall extending along the edge of the base plate, in which the semiconductor laser element and the photo-detecting element are contained in the space formed by the base plate and the sidewall, and the holographic element is mounted on the top of the side wall; and a lead frame extending from the outside of the body frame into the space formed by the base plate and the sidewall and being electrically connected to the semiconductor laser element and the photo-detecting element, wherein the photo-detecting element is mounted on a detector-mounting base; and the detector-mounting base is separated from the sidewall of the body frame.

In this semiconductor laser device, the detector-mounting base is separated from the sidewall of the body frame. Therefore, even if the body frame expands due to a rise in temperature or moisture absorption, the expansion causes no displacement of the detector-mounting base. Thus, the photo-detecting element is maintained at the same position and in the optimal condition for receiving the laser beam.

In a mode of the present invention, a mirror for reflecting the laser beam generated by the semiconductor laser element onto the holographic element is contained in the space formed by the base plate and the sidewall of the body frame, the mirror is mounted on a mirror-mounting base, and the mirror-mounting base is separated from the sidewall of the body frame. By this construction, expansion of the body frame causes no displacement of the mirror-mounting base and the mirror because the mirror-mounting base is separated from the sidewall of the body frame.

It is recommended to separate the mirror-mounting base from the detector-mounting base. By this construction, expansion of the mirror-mounting base or the detector-mounting base does not cause the displacement of the other.

It is recommended that the lead frame has an interposed part located between the detector-mounting base and the base plate of the body frame, the interposed part has a through-hole, and the detector-mounting base is connected to the base plate of the body frame through the through-hole of the lead frame. This construction eliminates the restriction on the shape of the lead frame due to the existence of the detector-mounting base and facilitates the production of the lead frame. It is also easy to provide adequate strength to the detector-mounting base.

When the mirror is provided, it is recommended that the lead frame has an interposed part located between the mirror-mounting base and the base plate of the body frame, the interposed part has a through-hole, and the mirror-mounting base is connected to the base plate of the body frame through the through-hole of the lead frame.

It is also recommended that the lead frame has an interposed part located between the base plate and a section of the sidewall of the body frame on which the holographic element is mounted, the interposed part has a through-hole, and the section of the sidewall of the body frame on which the holographic element is mounted is connected to the base plate of the body frame through the through-hole of the lead frame. This construction provides adequate strength to the section of the sidewall of the body frame functioning as the mounting base for the holographic element.

It is also possible that the lead frame has no part thereof located between the base plate and the section of the sidewall of the body frame on which the holographic element is mounted.

It is recommended that the lead frame has a projection substantially perpendicular to the base plate of the body frame, and is engaged with the base plate by the projection. This construction prevents the lead frame from separating off the body frame.

It is possible that the semiconductor laser element is mounted on a laser-mounting base, and a section of the base plate of the body frame has a through-hole located under the laser-mounting base. By this construction, the heat that the semiconductor laser element generates during its operation is released by way of the through-hole of the body frame to the outside. This suppresses the thermal expansion of the laser-mounting base and the degradation of the semiconductor laser element.

Also, to achieve the aforementioned objective, the present invention provides an optical pickup for casting a laser beam onto an optical storage medium and for receiving the laser beam reflected by the optical storage medium to read information recorded on the optical storage medium, which includes the above-described semiconductor laser device. The photo-detecting element used in the aforementioned semiconductor laser device is maintained at a position where it can receive the laser beam in an optimal condition even under high temperature or humidity. Thus, the reliability of the optical pickup in reading signals is improved.

DESCRIPTION OF THE DRAWINGS

The objectives and the features of the present invention will be clearly understood from the following descriptions of the preferred embodiment with reference to the attached drawing, wherein.

DESCRIPTION OF THE PREFERRED EMBODIMENTS

An embodiment of the present invention is described with reference to the drawings. FIGS. 1A–1D and 2A–2C show the construction of the semiconductor laser device 100 of the present embodiment, and FIGS. 3A and 3B show the construction of an optical pickup 200 including the semiconductor laser device 100.

Figure 1A:
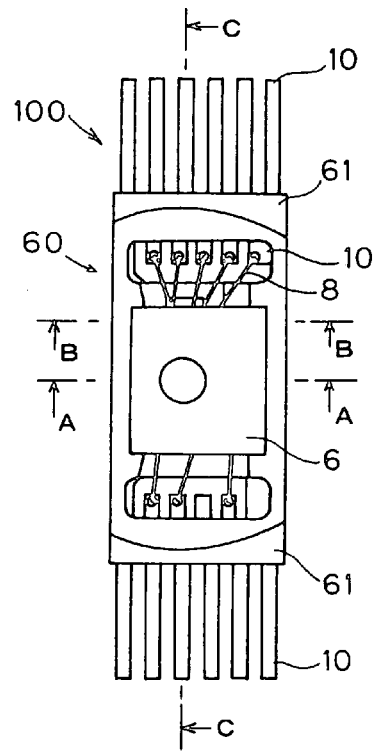
FIGS. 1A–1D schematically show the construction of a semiconductor laser device as one embodiment of the present invention.
Figure 1B:
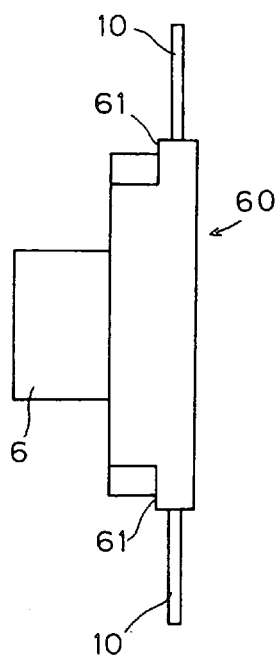
Figure 1C:
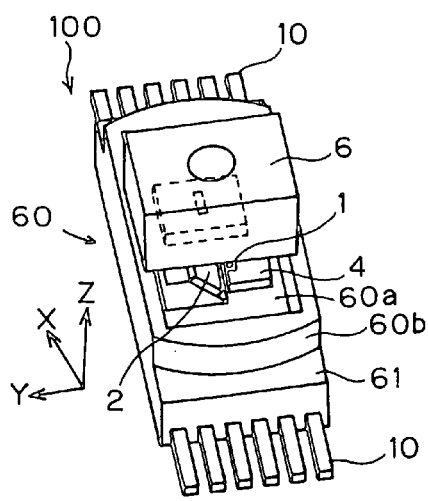
Figure 1D:
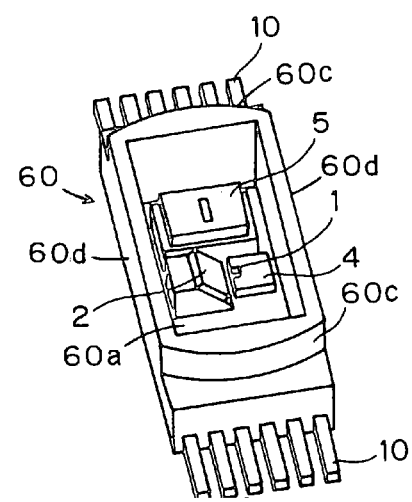
Figure 2A:
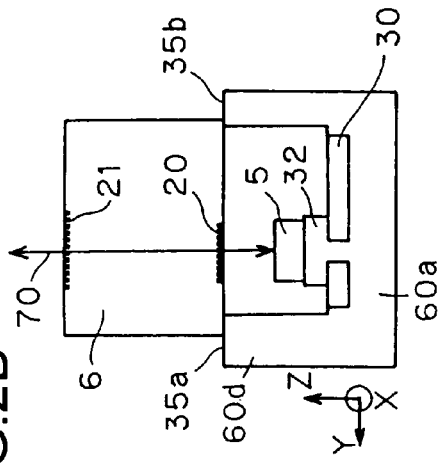
FIGS. 2A–2C schematically show the internal construction of the aforementioned semiconductor laser device.
Figure 2B:
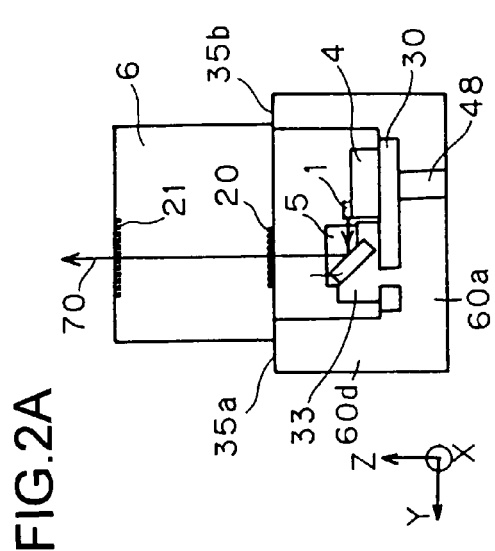
Figure 2C:
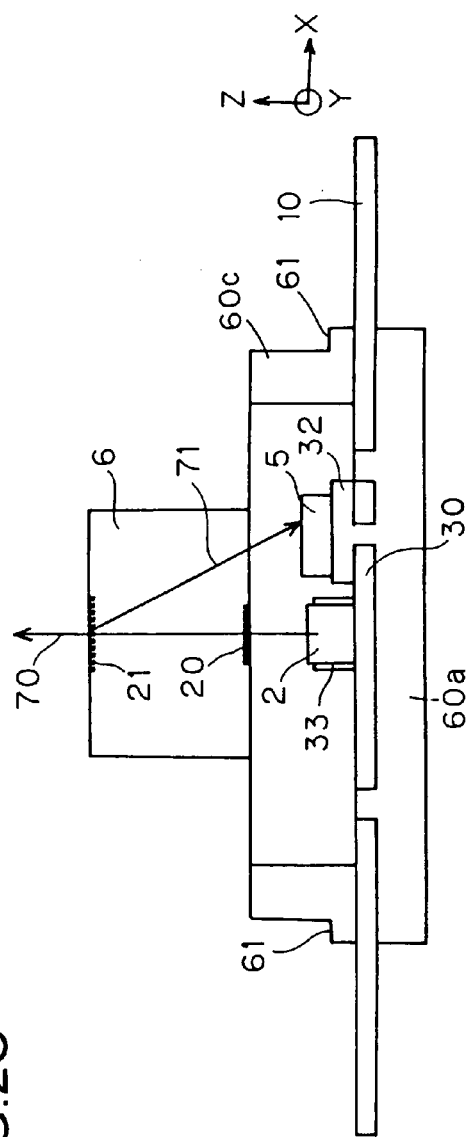

FIG. 1A is a plan view, FIG. 1B is a side view and FIG. 1C is a perspective view of the semiconductor laser device 100, and FIG. 1D is another perspective view in which the holographic element is removed from FIG. 1C to show the inside of the device. FIGS. 2A–2C show the inside of the semiconductor laser device 100, where FIG. 2A is the cross sectional view at line A—A in FIG. 1A, FIG. 2B is the cross sectional view at line B—B, and FIG. 2C is the cross sectional view at line C—C. FIGS. 2A and 2B correspond to Y-Z sections on the Cartesian coordinates shown in FIG. 1C. Similarly, FIG. 2C corresponds to an X-Z section.

In the drawings, numeral 1 denotes a semiconductor laser element, 2 denotes a reflecting mirror, 10 denotes a lead frame, 4 denotes a sub-mount with a monitoring photodiode, 5 denotes a photo-detecting element for reading signals (which consists of a photodiode integrated with a signal-processing circuit), and 6 denotes a holographic element. The holographic element 6 has a grating pattern 20 for generating a three-beam and a holographic pattern 21 for splitting the beam, formed on its upper and lower faces, respectively.

Figure 3A:
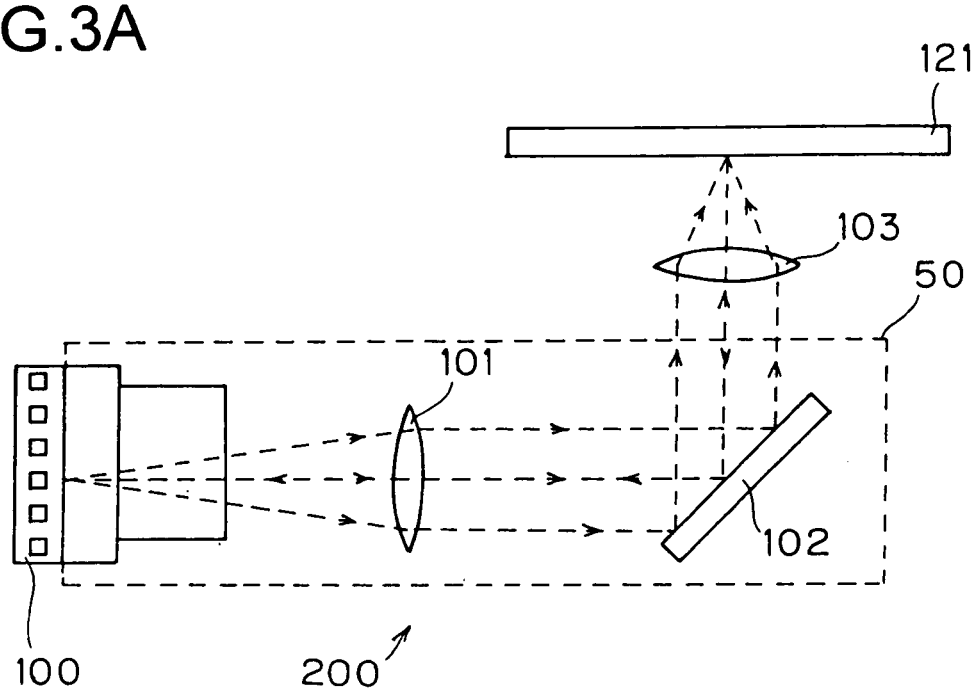
FIGS. 3A and 3B schematically show the construction of the optical pickup as another embodiment of the present invention.
Figure 3B:
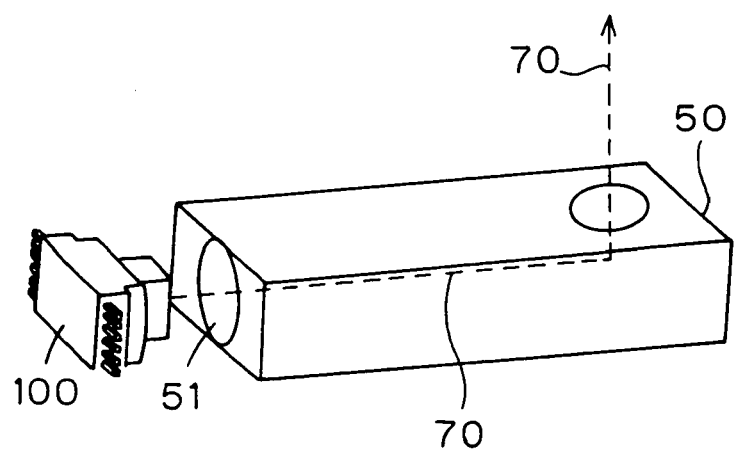

In FIGS. 3A and 3B showing the optical pickup 200, numeral 101 denotes a collimator lens, 102 denotes a reflecting mirror, 103 denotes a condenser lens and 121 denotes an optical disc. Numeral 50 denotes a casing of the optical pickup 200 onto which the collimator lens 101, reflecting mirror 102 and other elements are attached. Numeral 51 denotes a circular hole to which the semiconductor laser device 100 is attached. Numeral 70 denotes the optical axis of the semiconductor laser device 100. The collimator lens 101 and the reflecting mirror 102 are arranged within the casing 50 so that they are accurately located on the optical axis 70 of the semiconductor device 100 defined by the circular hole 51 of the casing 50.

As shown in FIGS. 1A–1D and 2A–2C, the package of the semiconductor laser device 100 consists of a body frame 60 made of an insulating resin with a base plate 60a and a sidewall 60b extending along the edge of the base plate 60a. The sidewall 60b has a pair of arc sections 60c facing each other and a pair of straight sections 60d facing each other. The holographic element 6 is mounted on the straight sections 60d. Each of the two arc sections 60c corresponds to a section of the same circle. The body frame 60 is attached to the casing 50 of the optical pickup 200 so that the outer surfaces of the arc sections 60c comes in contact with the circumferential surface of the circular hole 51.

Located inside the body frame 60 is the lead frame 10 extending to the outside, the semiconductor laser element 1, the photo-detecting element 5 and the mirror 2. The semiconductor laser element 1 is mounted on the sub-mount 4, which functions as the mounting base. The photo-detecting element 5 is mounted on the mounting base 32 made of a resin. The mirror 2 is mounted on an inclined plane of the mounting base 33 made of a resin, where the plane is at an angle of 45 degrees from the island plate 30 of the lead frame 10. The electrodes of the semiconductor laser element 1 and the photo-detecting element 5 are electrically connected to the lead frame 10 by Au (gold) wires 8.

The lead frame 10 is integrally formed with the body frame 60 when the body frame 60 is manufactured by molding. The semiconductor laser element 1 is fixed onto the laser-mounting base (i.e. sub-mount) 4 with a bond, and the laser-mounting base 4 is fixed onto the island plate 30 of the lead frame 10 with a bond. The detector-mounting base 32 is integrally formed with the base plate 60a when the body frame 60 is molded, and the photo-detecting element 5 is adhered to the detector-mounting base 32 with a bond. Similarly, the mirror-mounting base 33 is integrally formed with the base plate 60a when the body frame 60 is molded, and the mirror 2 is adhered to the aforementioned inclined plane with a bond. Holographic element 6 is adhered to the top 35a, 35b of the straight sections 60d of the sidewall 60b of the body frame 60 with a bond.

The semiconductor laser element 1 is installed so that the optical axis 70 coincides with the center of the arc sections 60c of the body frame 60. The body frame 60 has a reference plane 61, and the distance between the reference plane 61 and the emission point of the semiconductor laser element 1 in the Z-axis direction is adjusted at a predetermined distance.

The arc sections 60c of the body frame 60 are asymmetrical with respect to the Y-axis. This is to eliminate the necessity of positioning the semiconductor laser element 1 at the center of the body frame 60 and make the semiconductor laser device 100 smaller in size. It is possible to make the arc sections 60c symmetrical with respect to the Y-axis. By such a design, however, the semiconductor laser element 1 must be positioned at the center of the body frame 60, leaving an unused space having approximately the same size as the photo-detecting element 5, on the side opposite to the photo-detecting element 5.

In this device 100, the semiconductor laser element 1 generates a laser beam, and the mirror 2 changes the beam's direction by 90 degrees so that the beam passes through the holographic element 6 and exits the semiconductor laser device 100 in the Z-axis direction. As shown in FIG. 3A, the collimator lens 101 transforms the exiting laser beam into a parallel beam, and the mirror 102 changes the beam's direction by 90 degrees so that the beam passes through the condenser lens 103 and is converged onto the optical disc 121.

The laser beam converged onto the optical disc 121 is reflected by the disc 121 and inversely traces the optical path (condenser lens 101→mirror 2→collimator lens 101) back to the semiconductor laser device 100. As shown in FIG. 2C, the returning laser beam is diffracted by the holographic pattern 21 of the holographic element 6, travels along the optical axis 71 tilted from the original optical axis 70 and is cast onto the photo-detecting element 5. The photo-detecting element 5 generates detection signals, from which the information recorded on the optical disc can be obtained.

A portion of the laser beam exits the semiconductor laser element 1 in the direction opposite to the collimator lens 101 and is received by the monitoring photodiode located under the semiconductor laser element 1. The power of the semiconductor laser element 1 is controlled so that the photodiode receives the same amount of light at all times. Thus, the amount of the light cast onto the optical disc 121 is stabilized.

The rotational position of the semiconductor laser device 100 is adjusted so that the three-beam generated by the grating pattern 20 of the holographic element 6 comes to the desired position on the optical disc 121 when the semiconductor laser device 100 is inserted into the hole 51 of the casing 50 of the optical pickup 200, as shown in FIG. 3A.

In this state, the semiconductor laser device 100 is adhered to the casing 50 to complete the optical pickup 200.

Under the conditions of high temperature or humidity, the body frame 60 of the semiconductor laser device 100 expands due to a rise in temperature or moisture absorption because it is made of a resin. To prevent the semiconductor laser element 1, the mirror 2, the photo-detecting element 5 and the holographic element 6 from changing their relative position due to the expansion, the device of in this embodiment has adopted a specific construction, which is described below with reference to FIGS. 4A–4D.

Figure 4A:
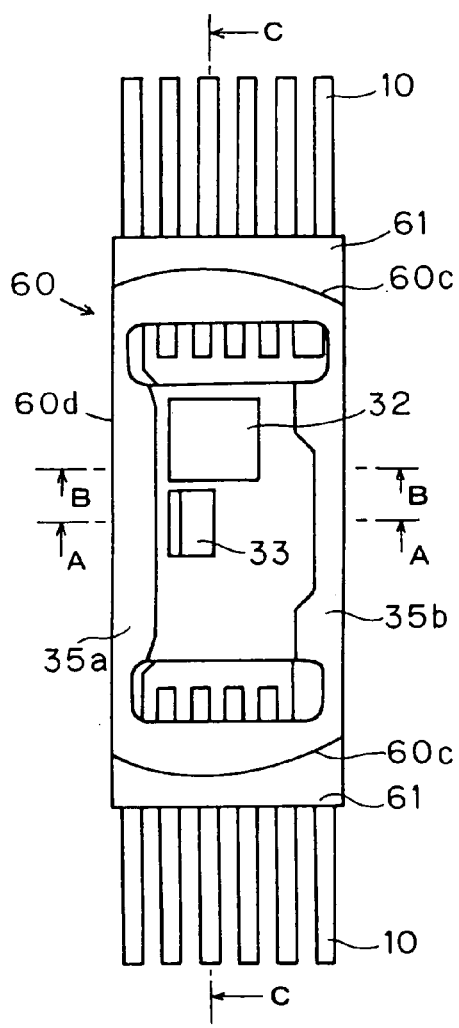
FIGS. 4A–4D schematically show the characteristics of optical-element-mounting bases of the aforementioned semiconductor laser device.
Figure 4D:
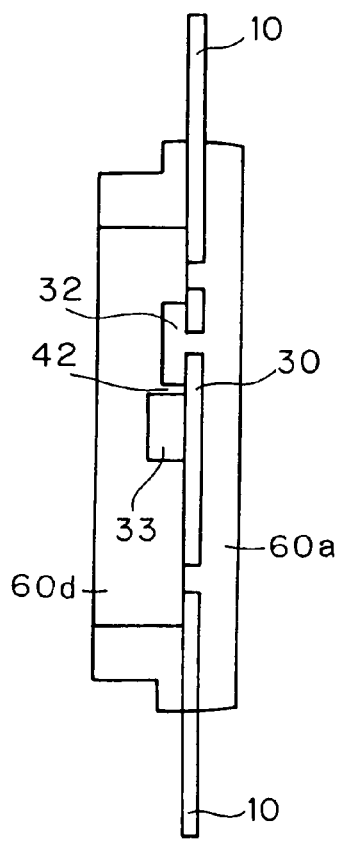
Figure 4B:
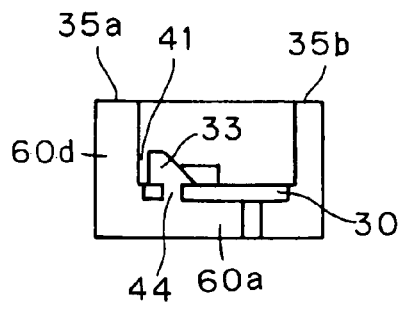
Figure 4C:
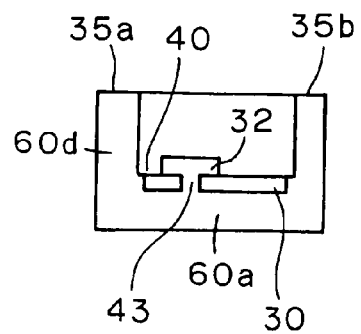

FIGS. 4A–4D show the body frame 60 without the elements 1, 2, 5 and 6, where FIG. 4A is a plan view, FIG. 4B is the cross sectional view at line A—A in FIG. 4A, FIG. 4C is the cross-sectional view at line B—B, FIG. 4D is the cross sectional view at line C—C. FIGS. 4B and 4C correspond to Y-Z sections on the Cartesian coordinates shown in FIG. 1C. Similarly, FIG. 4D corresponds to an X-Z section.

(1) The detector-mounting base 32 is separated from the sidewall. 60b (60d) of the body frame 60, leaving a gap 40.

(2) The mirror-mounting base 33 is separated from the sidewall 60b (60d) of the body frame 60, leaving a gap 41.

(3) The mirror-mounting base 33 is separated from the detector-mounting base 32, leaving a gap 42.

Since the mounting bases 32, 33 and 60d for mounting the photo-detecting elements 5, the mirror 2 and the holographic element 6 thereon are separated from each other, expansion of the mounting bases will be absorbed by the gaps 40, 41 and 42, so that it never causes the displacement of the other bases.

(4) The detector-mounting base 32 separated from the sidewall 60b (60d) of the body frame 60 is connected to the base plate 60a of the body frame 60 through the through-hole 43 formed in the island plate 30. The through-hole 43 is located under the center of the detector-mounting base 32.

(5) The mirror-mounting base 33 separated from the sidewall 60b (60d) of the body frame 60 is connected to the base plate 60a of the body frame 60 through the through-hole 44 formed in the island plate 30. The through-hole 44 is located under the center of the mirror-mounting base 33.

Thus, the through-holes 43 and 44 are formed in the island plate 30, and the mounting bases 32 and 33 for the photo-detecting element 5 and the mirror 2 are connected to the base plate 60a of the body frame 60 through these holes. This construction provides adequate strength to the mounting bases 32 and 33. It also prevents the undesired restriction on the shape of the island plate 30 that would otherwise occur when the mounting bases 32 and 33 are located on the island plate 30. Thus, the production of the lead frame 10 is facilitated. Furthermore, since the through-holes 43, 44 are located at the centers of the mounting bases 32 and 33, respectively, the center of each of the mounting bases 32 and 33 does not move even if the mounting bases 32 and 33 expand due to a rise in temperature or moisture absorption; the expansion only produces radial changes of the bases 32 and 33 around the through-holes 43 and 44, respectively.

The above-described construction prevents the displacements of the mounting bases, which have been observed in conventional constructions with the mounting bases connected to each other. Thus, the semiconductor laser device according to the invention exhibits a stable performance.

Figure 5C:
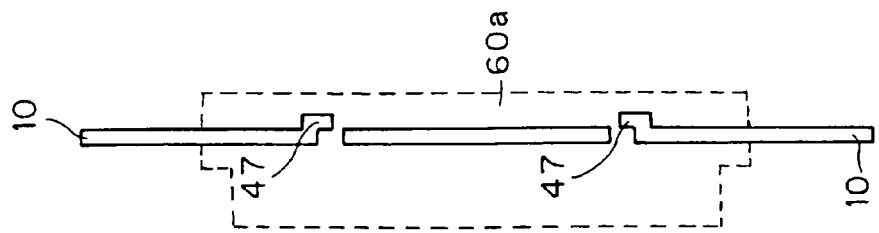
FIGS. 5A–5C schematically show the shape of the lead frame of the aforementioned semiconductor laser device.
Figure 5B:
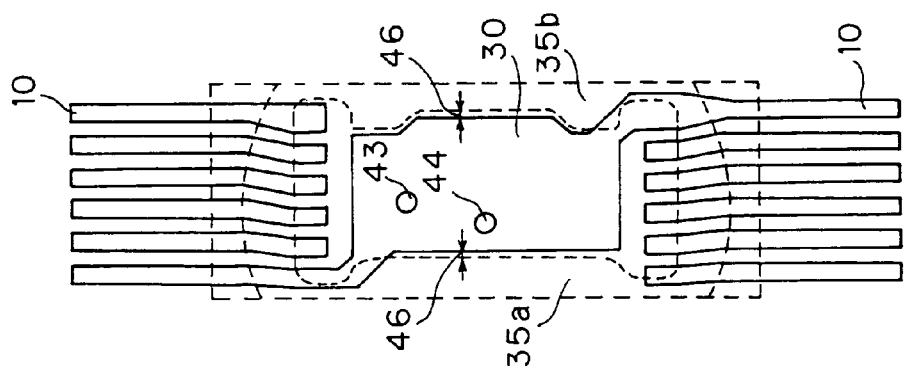
Figure 5A:
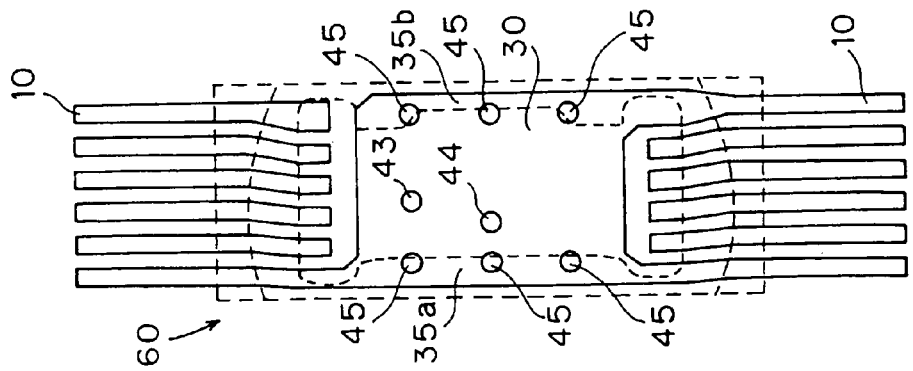
Figure 6A:
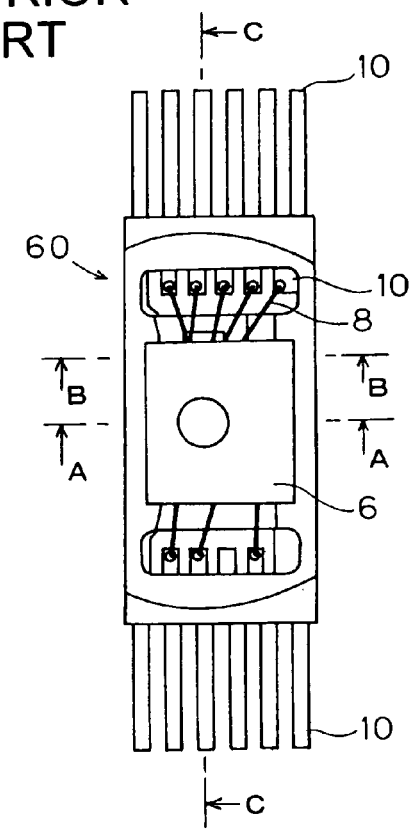
FIGS. 6A–6D schematically show the construction of a conventional semiconductor laser device.
Figure 6B:
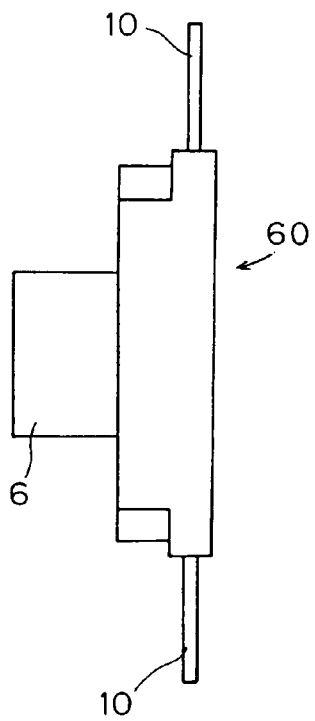
Figure 6C:
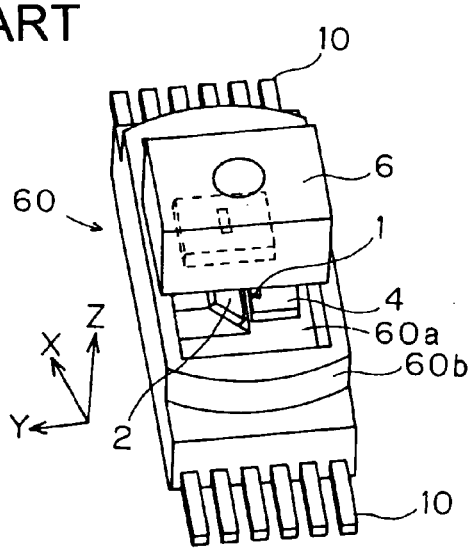
Figure 6D:
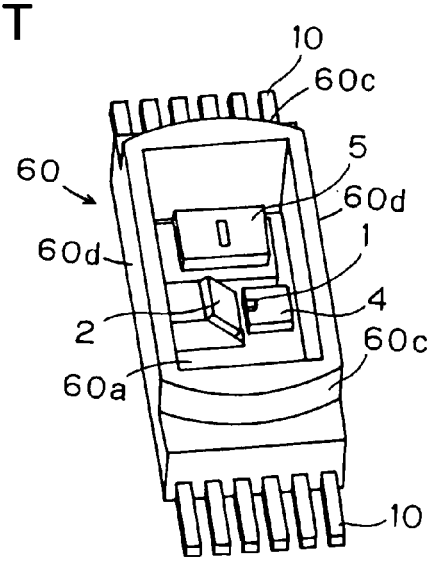
Figure 7A:
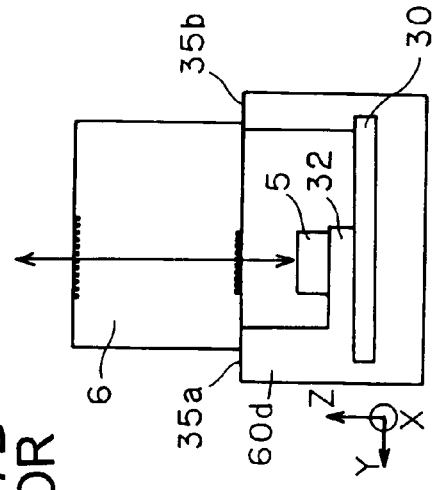
FIGS. 7A–7C schematically show the internal construction of the aforementioned conventional semiconductor laser device.
Figure 7B:
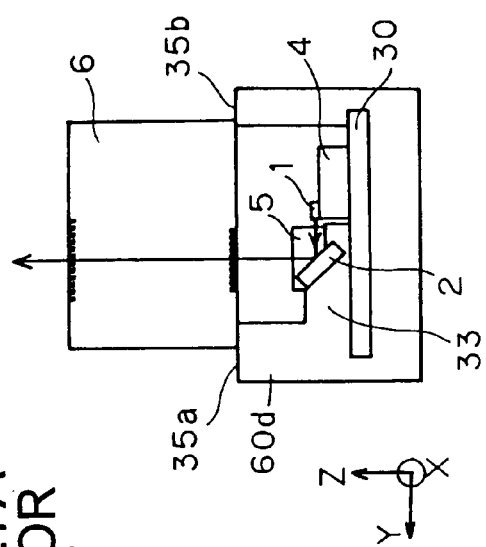
Figure 7C:
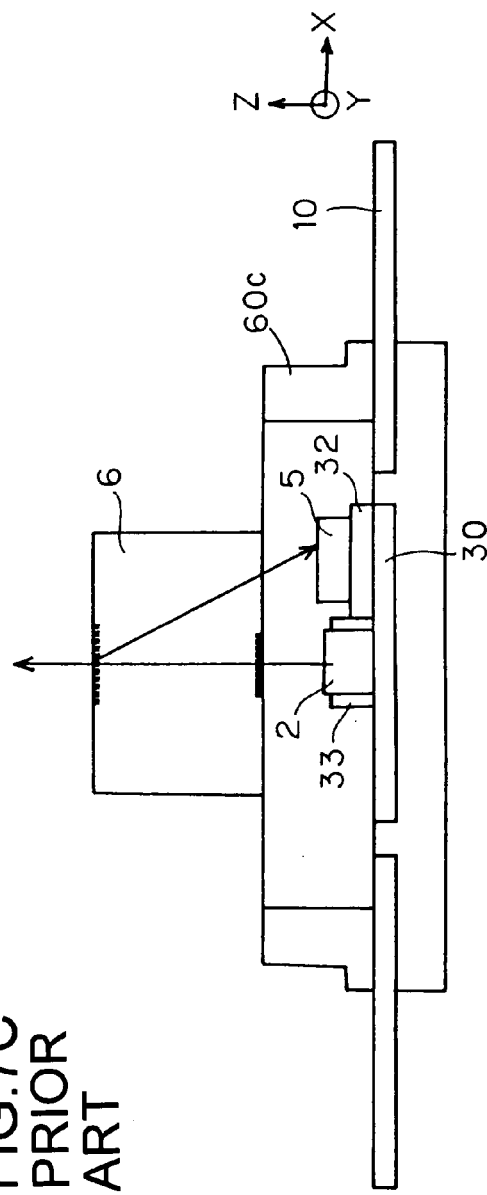

FIGS. 5A–5C show examples of the shape of the lead frame 10. FIGS. 5A and 5B correspond to see-through views of the top of two different examples, and FIG. 5C shows a common see-through view of the side of the two examples. The solid line shows the lead frame 10, and the broken line shows the body frame 60.

In the lead frame 10 shown in FIG. 5A, the island plate 30 has a simple, somewhat rectangular shape, both sides of which are extended to the positions under the straight sections 60d of the body frame 60. Each part of the island plate 30 located under the straight sections 60d of the body frame 60 is provided with plural through-holes 45, through which the straight section 60d of the body frame 60 is connected to the base plate 60a.

Even when, as described above, the island plate 30 has a simple shape with some parts located under the straight section 60d, it is possible to provide adequate strength to the straight section 60d, onto which the holographic element 6 is to be mounted, by forming through-holes 45 in the island plate 30 and connecting the straight section 60d to the base plate 60a through these holes 45. By this construction, the holographic element 6 is maintained at the same position, so that its relative position with respect to other optical elements 1, 2 and 5 remains unchanged.

On the other hand, in the lead frame 10 shown in FIG. 5B, the shape of the island plate 30 is approximately the same as that of the inside of the straight sections 60d of the body frame 60; it is not extended to the straight sections 60d. There is a gap 46 between the island plate 30 and the straight sections 60d of the body frame 60, and the straight sections 60d is directly connected to the base plate 60a. This construction provides more strength to the straight sections 60d of the body frame 60 onto which the holographic element 6 is to be mounted, though the shape of the island plate 30 becomes complex to a certain extent.

In any of the constructions shown in FIGS. 5A and 5B, each of the leads of the lead frame 10 that are not connected to the island plate 30 has a bend 47 at its end, as shown in FIG. 5C. The bend 47 is to be engaged with the base plate 60a of the body frame 60, which prevents the lead from coming off the body frame 60. Even a simple downward projection formed at the end of the lead also works.

Furthermore, as shown in FIG. 2A, a part of the base plate 60a of the body frame 60 located under the mounting base (i.e. sub-mount) 4 of the semiconductor laser element 1 has a through-hole 48. The heat that the semiconductor laser element 1 generates during its operation is conducted to the laser-mounting base 4 and finally released from the through-hole 48 to the outside. This suppresses the rise in the temperature of the semiconductor laser element 1 and accordingly alleviates the thermal stress working on the semiconductor laser element 1. Expansion of the laser-mounting base 4 is also reduced, so that the relative position of the semiconductor laser element 1 with respect to the other optical elements 2, 5 and 6 remains unchanged.

From the foregoing descriptions, it is clear that the present invention may be modified or changed in various forms. It should be understood that the present invention can be carried out within the scope of the attached claims without being restricted by the specific descriptions.

What is claimed is:

1. A semiconductor laser device comprising:
   a semiconductor laser element for generating a laser beam;
   a photo-detecting element for receiving the laser beam reflected by an external optical storage medium;
   a holographic element for guiding the laser beam generated by the semiconductor laser element to the outside and for guiding the laser beam reflected by the optical storage medium to the photo-detecting element;
   a body frame made of resin having a base plate and a sidewall extending along the edge of the base plate, in which the semiconductor laser element and the photo-detecting element are contained in a space formed by the base plate and the sidewall, and the holographic element is mounted on a top of the body frame; and a lead frame extending from the outside of the body frame into the space formed by the base plate and the sidewall and being electrically connected to the semiconductor laser element and the photo-detecting element, wherein:

the photo-detecting element is mounted on a detector-mounting base which is integrally formed with the base plate so as to protrude upward therefrom; and the detector-mounting base is separated from the sidewall of the body frame.

2. The semiconductor laser device according to claim 1, further comprising:

a mirror for reflecting the laser beam generated by the semiconductor laser element onto the holographic element, said mirror being contained in the space formed by the base plate and the sidewall of the body frame, wherein:

the mirror is mounted on a mirror-mounting base which is integrally formed with the base plate so as to protrude upward therefrom; and the mirror-mounting base is separated from the sidewall of the body frame.

3. The semiconductor laser device according to claim 2, wherein the mirror-mounting base is separated from the detector-mounting base.

4. The semiconductor laser device according to claim 1, wherein:

the lead frame has an interposed part located between the detector-mounting base and the base plate of the body frame, the interposed part having a through-hole; and the detector-mounting base is connected to the base plate of the body frame through the through-hole of the lead frame.

5. The semiconductor laser device according to claim 2, wherein:

the lead frame has an interposed part located between the mirror-mounting base and the base plate of the body frame, the interposed part having a through-hole; and the mirror-mounting base is connected to the base plate of the body frame through the through-hole of the lead frame.

6. The semiconductor laser device according to claim 1, wherein:

the lead frame has an interposed part located between the base plate and a section of the sidewall of the body frame on which the holographic element is mounted, the interposed part having a through-hole; and the section of the sidewall of the body frame on which the holographic element is mounted is connected to the base plate of the body frame through the through-hole of the lead frame.

7. The semiconductor laser device according to claim 1, wherein the lead frame has no part thereof located between the base plate and a section of the sidewall of the body frame on which the holographic element is mounted.

8. The semiconductor laser device according to claim 1, wherein the lead frame has a projection substantially perpendicular to the base plate of the body frame, and is engaged with the base plate by the projection.

9. The semiconductor laser device according to claim 1, wherein:

the semiconductor laser element is mounted on a laser-mounting base, and a section of the base plate of the body frame has a through-hole located under the laser-mounting base.

10. An optical pickup for casting a laser beam onto an optical storage medium and for receiving the laser beam reflected by the optical storage medium to read information recorded on the optical storage medium, wherein the optical pickup device comprises a semiconductor laser device according to claim 1.

* * * * *